United States Patent
Yin et al.

(10) Patent No.: US 8,217,328 B2
(45) Date of Patent: Jul. 10, 2012

(54) LOW NOISE PIXEL READOUT CIRCUIT WITH HIGH CONVERSION GAIN

(75) Inventors: Ping-Hung Yin, Tainan (TW); Amit Mittra, Tainan (TW); Chi-Shao Lin, Tainan (TW)

(73) Assignee: Himax Imaging, Inc., Grand Cayman (KY)

( * ) Notice: Subject to any disclaimer, the term of this patent is extended or adjusted under 35 U.S.C. 154(b) by 486 days.

(21) Appl. No.: 12/436,045

(22) Filed: May 5, 2009

(65) Prior Publication Data

US 2010/0282946 A1   Nov. 11, 2010

(51) Int. Cl.
*H03F 3/08* (2006.01)
*H01L 27/00* (2006.01)

(52) U.S. Cl. .................. 250/208.1; 250/214 A
(58) Field of Classification Search .............. 250/214 R, 250/208.1, 214 A; 348/302, 308, 297
See application file for complete search history.

(56) References Cited

U.S. PATENT DOCUMENTS

2006/0237631 A1* 10/2006 Koyama .................. 250/214 A

* cited by examiner

*Primary Examiner* — Tony Ko
(74) *Attorney, Agent, or Firm* — Stout, Uxa, Buyan & Mullins, LLP

(57) ABSTRACT

A pixel circuit of a CMOS image sensor is disclosed. At least two transfer transistors are configured to transfer integrated light signals of corresponding photodetectors to a first node. A reset transistor is configured to reset the first node to a predetermined reset voltage of a second node, and a source follower is configured to buffer the integrated light signals. In one embodiment, a capacitor is further connected between the first node and the second node to minimize influence of the effective capacitance including capacitance of a floating diffusion region and parasitic capacitance due to the photodetector and the transfer transistor.

11 Claims, 8 Drawing Sheets

LOW NOISE PIXEL READOUT CIRCUIT WITH HIGH CONVERSION GAIN

BACKGROUND OF THE INVENTION

1. Field of the Invention

The present invention generally relates to a CMOS image sensor, and more particularly to a pixel readout circuit of the CMOS image sensor with substantially reduced area, and to a pixel readout circuit with a feedback or switch capacitor.

2. Description of the Prior Art

A complementary metal-oxide-semiconductor (CMOS) image sensor is an electronic device that acquires image information in, for example, a camera by transforming light intensity into charge, which is then converted to a voltage and finally read out. FIG. 1A shows a passive pixel sensor (PPS), which can be considered an early-genre CMOS image sensor. In the figure, only two pixels of a pixel array are shown for illustration purposes. Each pixel contains a photodiode D and an access transistor (or switch) $M_{acc}$. A word line (e.g., $WL_1$) is connected to the pixels in the same row, and a bit line (e.g., BL) is connected to the pixels in the same column. At the end of each bit line BL is an amplifier 10.

FIG. 1B shows an exemplary pixel circuit of an active pixel sensor (APS). Each pixel contains a photodiode D and three transistors—$M_{rst}$, $M_{sf}$, and $M_{sel}$, and thus this type of sensor is also known as three-transistor (3T) pixel circuit of the CMOS image sensor. The transistor $M_{rst}$, when it is turned on by a reset signal RST, is used to reset the photodiode D to a reset reference voltage, such as that of power supply $V_{DD}$. The transistor $M_{sf}$ acts as a source follower which buffers or amplifies the integrated light signal of the photodiode D. The transistor $M_{sel}$, when turned on by a word line signal WL, allows for read out of the pixel signal. The 3T pixel circuit alleviates a "stripe defect" of the passive pixel sensor due to random distribution of noise by the transistors $M_{sf}$ and $M_{rst}$. Nevertheless, the 3T pixel circuit suffers from high leakage current in its photodiode D. Moreover, even to the extent the stripe defect can be improved, the transistor Mrst introduces KT/Cp noise, which is relatively large since Cp, the parasitic capacitance, is very small.

FIG. 1C shows an exemplary pixel circuit of another active pixel sensor (APS). Each pixel contains a photodiode D and four transistors ($M_{tx}$, $M_{rst}$, $M_{sf}$, and $M_{sel}$), and accordingly this type of sensor is also known as a four-transistor (4T) pixel circuit of the CMOS image sensor. The 4T pixel circuit is arranged and functions similar to the 3T pixel circuit, except that an additional transistor $M_{tx}$, when turned on by a transfer signal TX, is used to controllably transfer the integrated light signal of the photodiode D. The 4T pixel circuit is capable of advantageously facilitating correlated double sampling (CDS) in the CMOS image sensor to eliminate the different characteristics across the pixels due to process variation. Also, the photodiode is designed to fully transfer integrated charges to the outside providing the potential and capacity of the floating diffusion FD are sufficient. Thus, by doing a correlated double sampling readout, KT/Cp noise can be totally removed, resulting in a very low temporal noise level. Moreover, the lack of contact inside the photodiode also contributes to a much lower dark current.

The pixel circuit of FIG. 1C, however, occupies substantial chip area, and is thus not adaptable to modern and high density CMOS image sensors. For the foregoing reason, a need has arisen to propose a pixel readout circuit of the CMOS image sensor that can effectively reduce an overall size of the entire pixel array of the CMOS image sensor.

SUMMARY OF THE INVENTION

In view of the foregoing, it is an object of the present invention to substantially reduce the overall size of the entire pixel array of the CMOS image sensor.

It is another object of the present invention to provide a pixel readout circuit of the CMOS image sensor that can minimize the influence of parasitic capacitance without sacrificing the performance and pixel sharing of the CMOS image sensor.

According to one embodiment, the pixel circuit of a CMOS image sensor includes at least two transfer transistors configured to transfer integrated light signals of the corresponding photodetectors to a first node. A floating diffusion region is connected to the first node. A reset transistor is configured to reset the first node to a predetermined reset voltage of a second node, and a source follower is configured to buffer the integrated light signal. The reset transistor and the source follower are shared among the at least two photodetectors. According to another embodiment, a capacitor is further connected between the first node and the second node to minimize influence of the effective capacitance.

DETAILED DESCRIPTION OF THE INVENTION

Figure 1A:
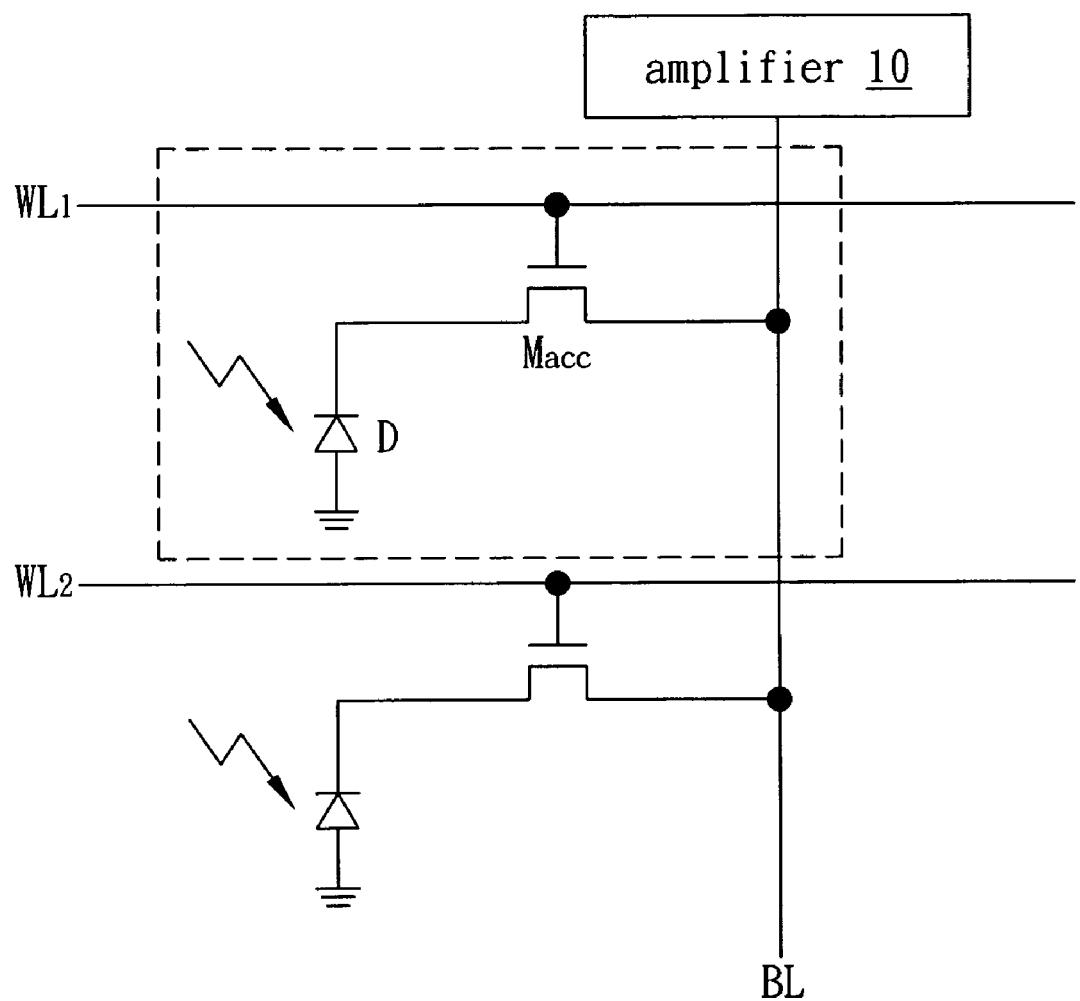
FIG. 1A shows a conventional passive pixel sensor.
Figure 1B:
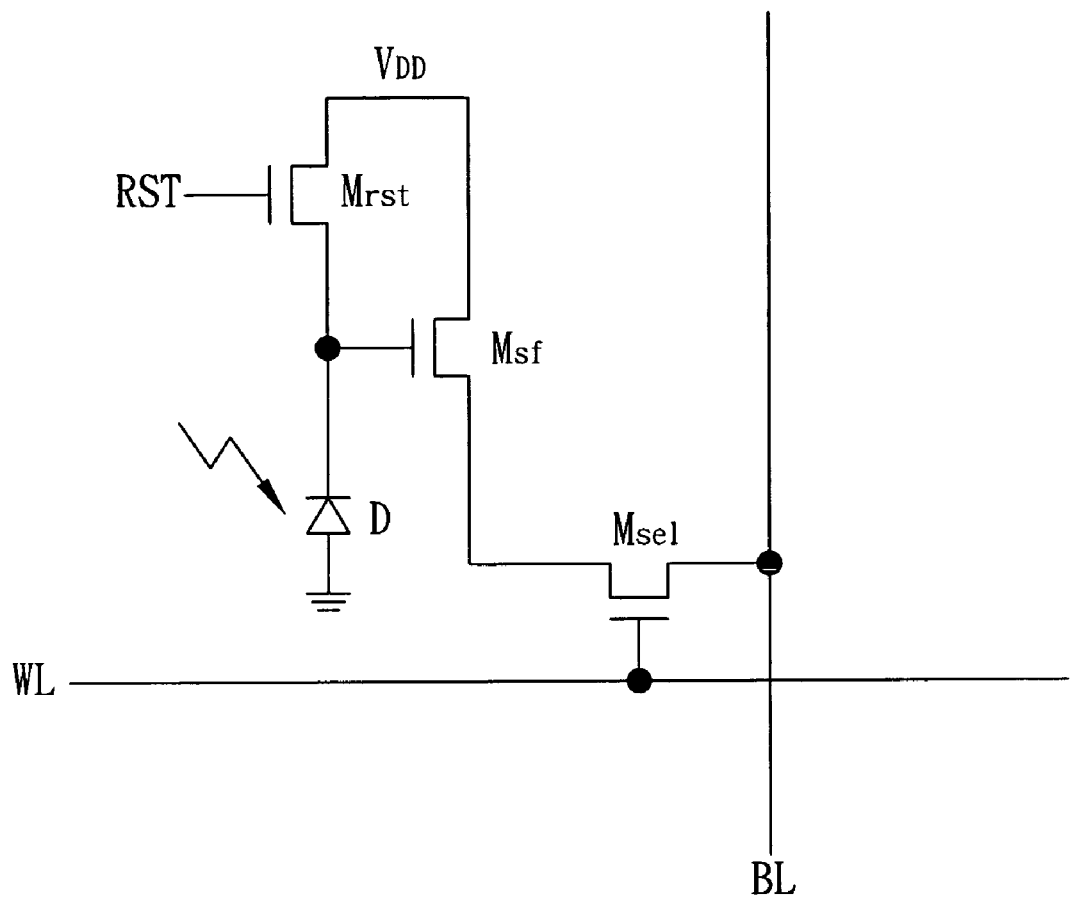
FIG. 1B shows a three-transistor (3T) pixel circuit of a conventional active pixel sensor.
Figure 1C:
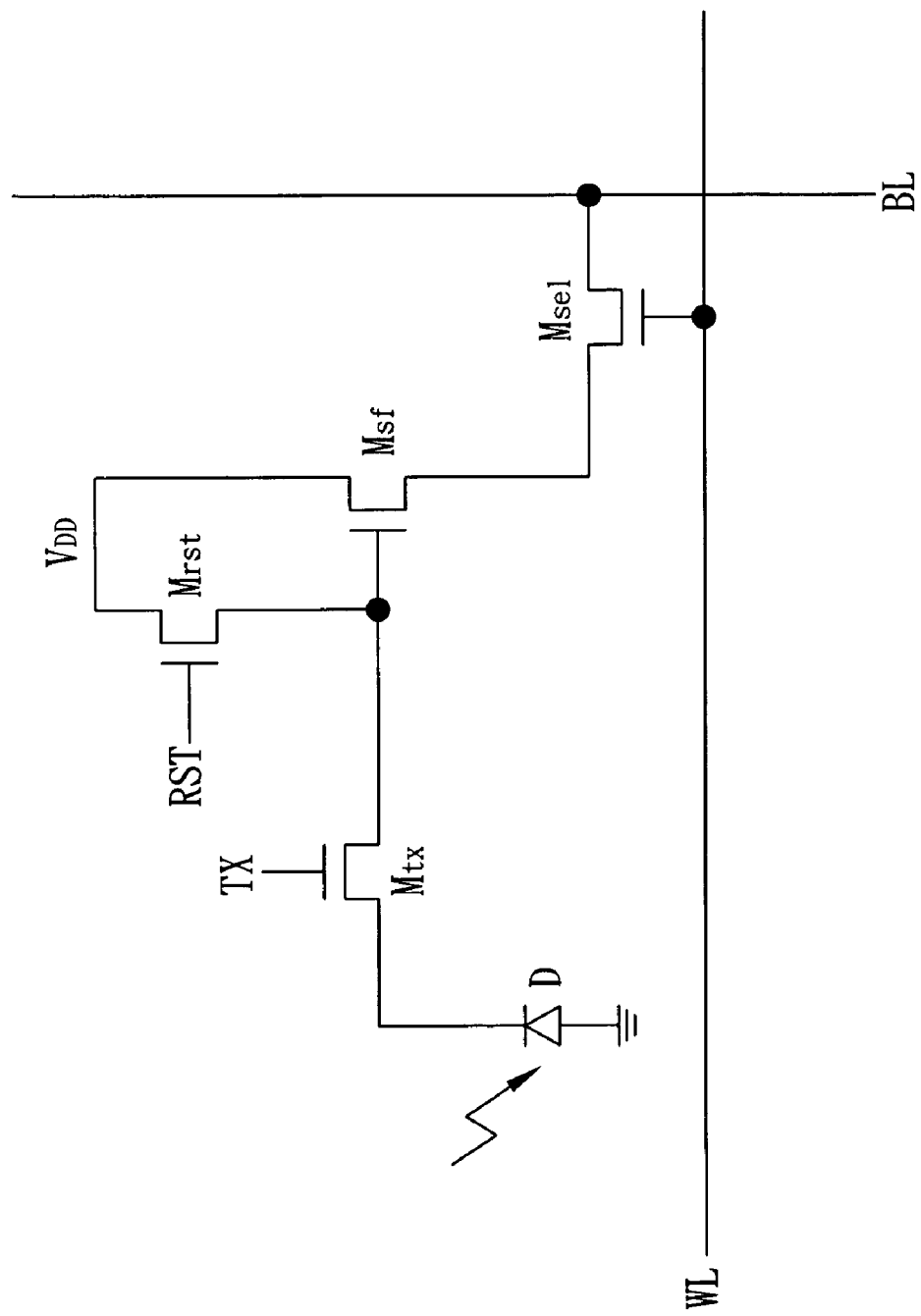
FIG. 1C shows a four-transistor (4T) pixel circuit of a conventional active pixel sensor.
Figure 2A:
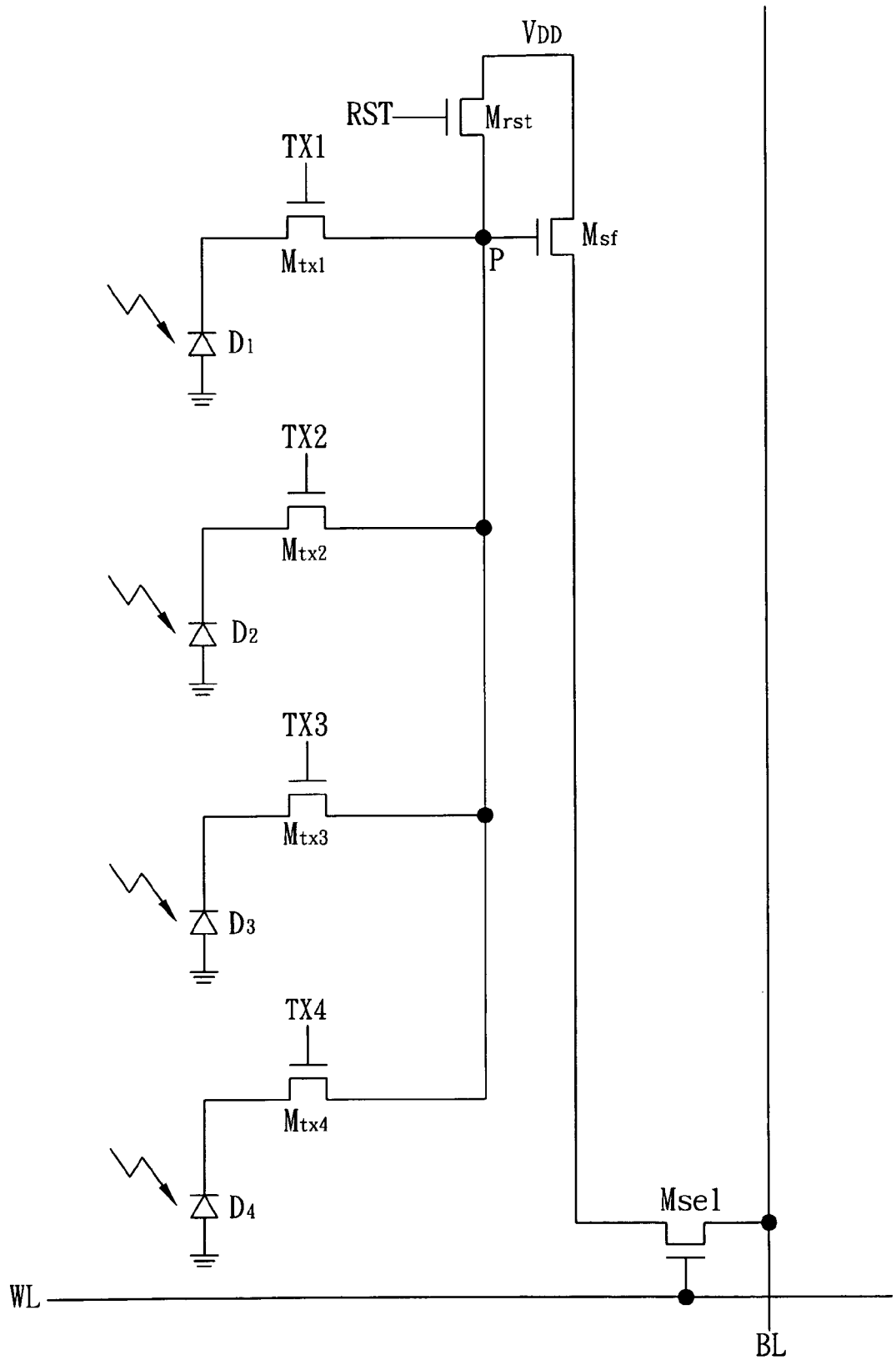
FIG. 2A shows a circuit diagram illustrating a 4T pixel circuit of a CMOS image sensor that is shared among four pixels according to one embodiment of the present invention.

FIG. 2A shows a circuit diagram illustrating a four-transistor (4T) pixel circuit of a complementary metal-oxide-semiconductor (CMOS) image sensor that is shared among four pixels (4S) according to one embodiment of the present invention. This embodiment is capable of reducing the overall size of the entire pixel array of the CMOS image sensor and/or making more area for the photodiodes. In the embodiment (and other embodiments in this specification), the pixel circuit is shared among, but not limited to, four pixels; moreover, the embodiment is not limited to 4T, and is well adaptable for other (such as 5T or above) pixel circuits. In this exemplary 4T 4S (4 transistors/4 shared photodiodes) pixel circuit, a number of photodetectors, such as pinned photodiodes $D_1$-$D_4$ associated with the four pixels, are respectively connected to transfer transistors $M_{tx1}$-$M_{tx4}$. In the embodiment, the transfer transistors $M_{tx1}$-$M_{tx4}$ are implemented with n-type metal-oxide-semiconductor (NMOS) devices. Each of the photodiodes $D_1$-$D_4$ is reverse-biased by way of its anode being connected to ground and its cathode being connected to a source/drain of the associated transfer transistors $M_{tx1}$-$M_{tx4}$. The other sources/drains of the transfer transistors $M_{tx1}$-$M_{tx4}$ are connected together, and further connected to a floating diffusion region P (or the first node) and the gate of a source follower $M_{sf}$ (e.g., an NMOS).

Although the amount of integrated charge Q of the photodiodes $D_1$-$D_4$ may be substantially increased under this 4T 4S pixel circuit, the pixel voltage (Q/CpXAsf, where $C_p$ is parasitic capacitance at the node P, and Asf is Msf source follower gain, normally=0.8~0.9) readout at the bit line BL is greatly influenced by, among other things, the parasitic capacitance. This influence can be attributed to the shared pixels. Maximizing the pixel voltage requires that the effective capacitance $C_p$ be kept at a minimum and yet big enough to contain all charges transferred from the photodiodes $D_1$-$D_4$. The paradox is that the design constraint to optimize the effective capacitance $C_p$ disadvantageously limits the number of pixels that can share a common readout circuit. In order to address this problem, the following embodiment is provided.

Figure 2B:
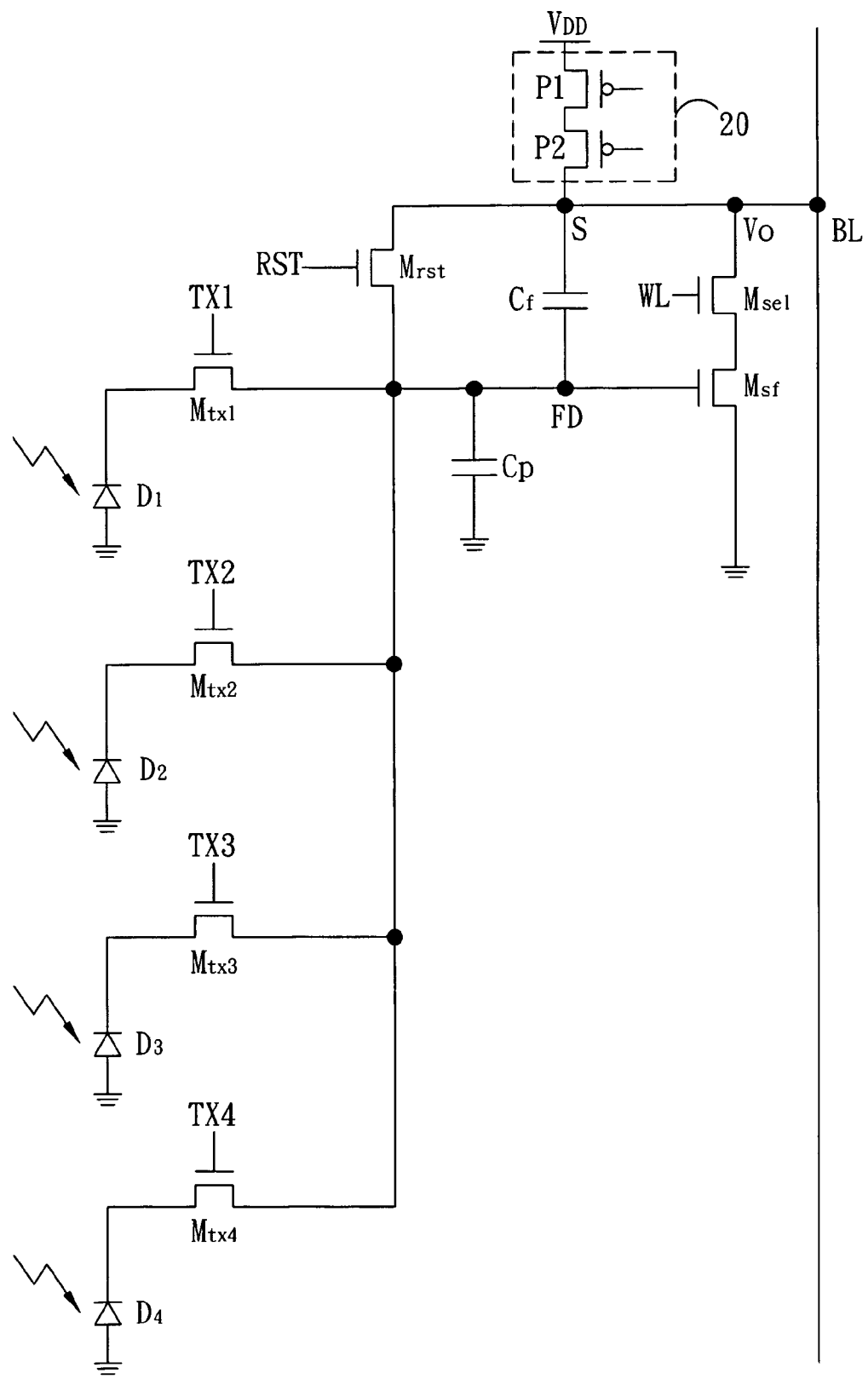
FIG. 2B shows a circuit diagram illustrating a 4T pixel circuit of a CMOS image sensor that is shared among four pixels according to another embodiment of the present invention.

FIG. 2B shows a circuit diagram illustrating a 4T pixel circuit of a CMOS image sensor of 4S type according to another embodiment of the present invention. In the embodiment, the transfer transistors $M_{tx1}$-$M_{tx4}$ are connected together, and connected to a floating diffusion region FD (i.e., the first node) and the gate of a source follower $M_{sf}$ (e.g., an NMOS). A capacitor $C_f$ is connected between the FD and node S (i.e., the second node). Another capacitor $C_p$ shown in the figure indicates an effective capacitance that includes at least the diffusion capacitance of FD, gate capacitance of source follower $M_{sf}$, and parasitic capacitance of the shared pixels. The source follower $M_{sf}$ is connected with a row selector transistor $M_{sel}$ (e.g., an NMOS) in series between the node S and ground. It will be appreciated by a person skilled in the pertinent art that the sequence of the serial-connected source follower $M_{sf}$ and row selector transistor $M_{sel}$ may be altered without affecting the function of the pixel circuit. A reset transistor $M_{rst}$ is arranged between the node S and the FD. A power or current source 20 is connected between power supply $V_{DD}$ and the node S. In the embodiment, two serial-connected p-type metal-oxide-semiconductor (PMOS) transistors $P_{1-2}$ constitute the power source 20. The gates of the PMOS transistors $P_{1-2}$ are biased by appropriate bias voltages (not shown) according to conventional techniques.

Operation of the 4T 4S pixel circuit of FIG. 2B can comprise performance of three phases as follows. First, in a reset phase, the reset transistor $M_{rst}$ is turned on by a reset signal RST, and the transfer transistors $M_{tx1}$-$M_{tx4}$ are turned on by transfer signals TX1-4, respectively. Accordingly, the photodiodes $D_1$-$D_4$ are reset to a so-called "pinning voltage," which is lower than a predetermined reference voltage at the node S that is lower than the power supply $V_{DD}$, and thus are fully depleted. In the embodiment, the source power 20 pulls down the power supply $V_{DD}$ for a predetermined value to provide the required reset reference voltage for the photodiodes $D_1$-$D_4$. Second, in an integration or accumulation phase, the reset transistor $M_{rst}$ and the transfer transistors $M_{tx1}$-$M_{tx4}$ are turned off, followed by subjecting the photodiodes $D_1$-$D_4$ to incident light. The voltages across the photodiodes $D_1$-$D_4$ decrease (or discharge) proportionally to the intensity of incident light impinging on the corresponding photodiodes $D_1$-$D_4$. Third, the reset transistor $M_{rst}$ is turned on again for a period, during which the floating diffusion FD is reset to the predetermined voltage as discussed above, followed by turning on the row selector transistor $M_{sel}$ to read out the reset (or dark) voltage. Subsequently, one of the transfer transistors $M_{tx1}$-$M_{tx4}$ (e.g., the transfer transistor $M_{tx1}$) is turned on, while the row selector transistor $M_{sel}$ is maintained on to transfer the integrated light signal of the photodiodes $D_1$-$D_4$ to the FD. The difference of the reset voltage and the integrated light signal is then generated (by an external circuit not shown in this figure but discussed later) to perform correlated double sampling (CDS). It will be appreciated by a person skilled in the pertinent art that resetting of the floating diffusion FD in the third phase may be omitted if execution of CDS is not required.

The photodiodes $D_1$-$D_4$ may be adaptively arranged according to a specific purpose. For example, in one embodiment, the photodiodes $D_1$, $D_2$, $D_3$ and $D_4$ are manufactured to detect red (R), green (G), red (R) and green (G), respectively. In operation, the transfer signals TX1 and TX3 turn on the transfer transistor $M_{tx1}$ and $M_{tx3}$ at the same time, and the transfer signals TX2 and TX4 turn on the transfer transistor $M_{tx2}$ and $M_{tx4}$ at the same time. This operation is often referred to as "charge binning" at pixel level. Such an arrangement substantially increases (or approximately doubles) the detecting area of red color and green color and therefore enhances performance in low-light conditions. By means of using feedback capacitor inside pixel, allowance is made for more pixels to do charge binning to enhance performance in low light conditions to a larger extent.

Figure 3A:
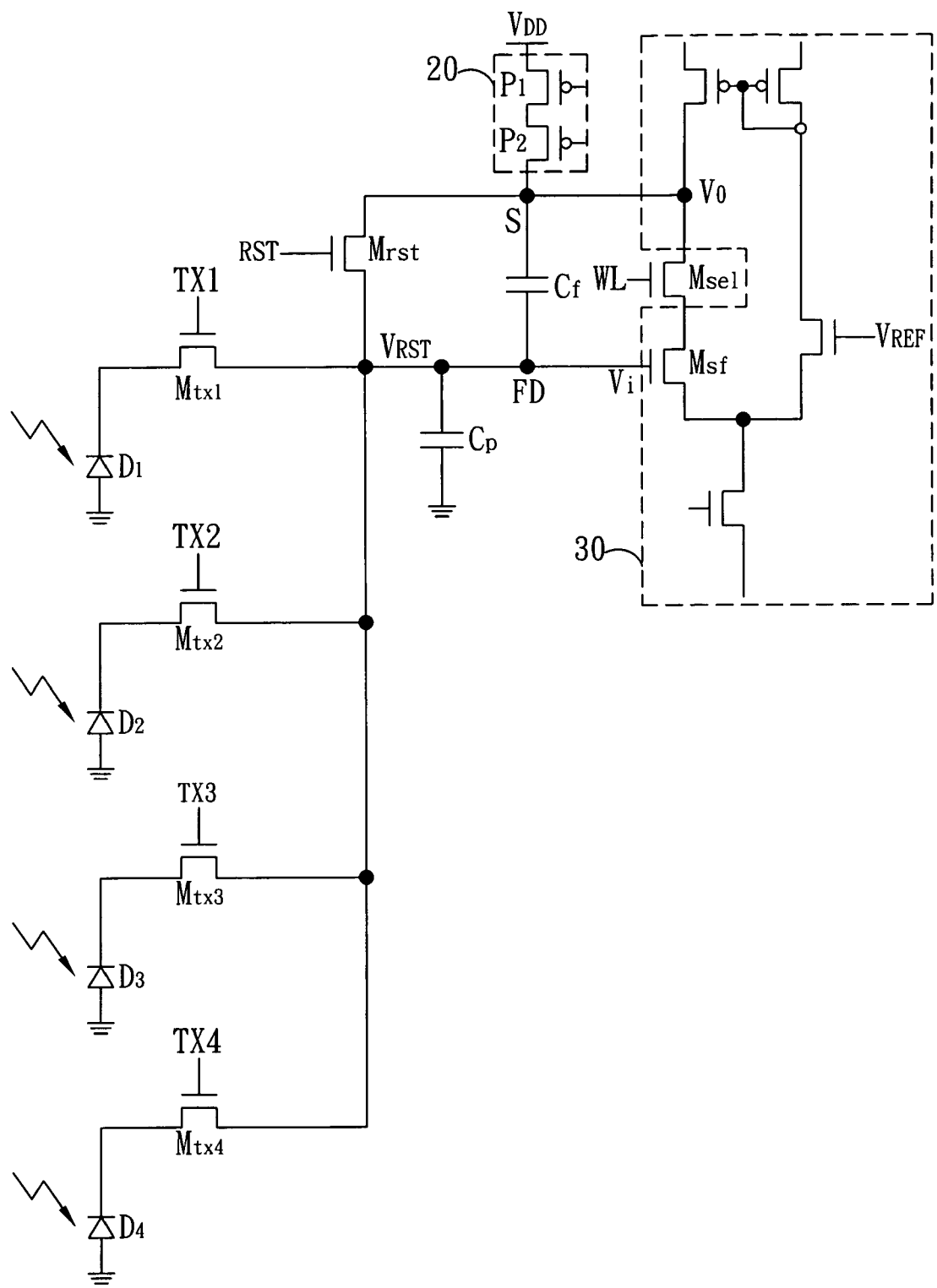
FIG. 3A shows a circuit diagram illustrating a 4T pixel circuit of a CMOS image sensor that is shared among four pixels according to a further embodiment of the present invention.

FIG. 3A shows a circuit diagram illustrating a 4T pixel circuit of a CMOS image sensor of 4S type according to a further embodiment of the present invention. In this exemplary 4T 4S pixel circuit, the interconnection of the photodiodes $D_1$-$D_4$, the transfer transistors $M_{tx1}$-$M_{tx4}$, the capacitor $C_f$ and the capacitor $C_p$ are the same as those in FIG. 2B, and associated descriptions are thus omitted herein for brevity. The source follower $M_{sf}$ is connected with the row selector transistor $M_{sel}$ (e.g., an NMOS) in serial.

An amplifier 30 which includes the source follower $M_{sf}$ is configured to input the voltage at the FD (or the first node). The output $V_o$ node (or the second node) of the amplifier 30 is feedback and connected to the second end of the capacitor $C_f$. The reset transistor $M_{rst}$ is arranged between the FD and the output of the amplifier 30. In the embodiment, the amplifier 30 is a standard differential amplifier. It is noted that amplifier 30 can be in other forms as long as it provides inverted signal phase and sufficient open-loop gain for desired close-loop gain accuracy.

Figure 3B:
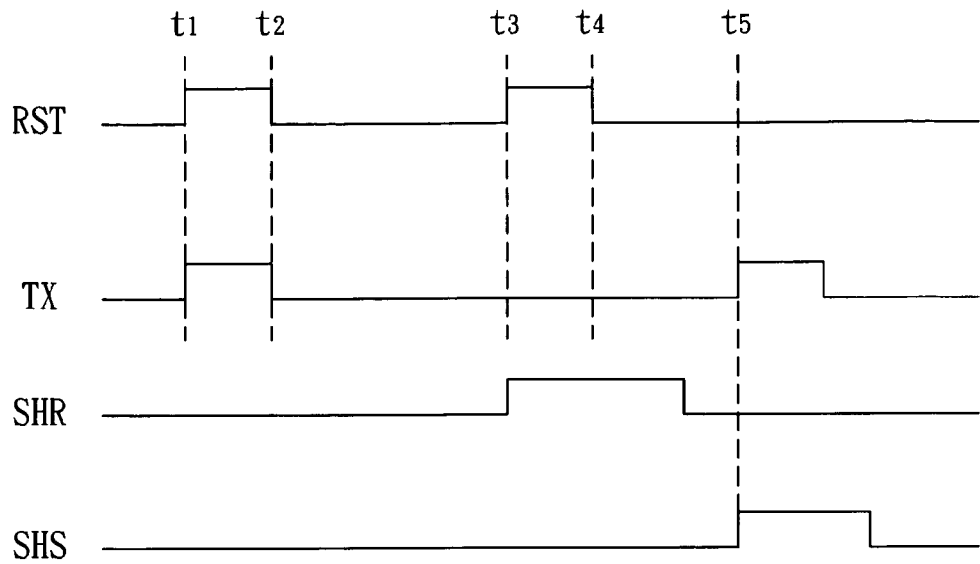
FIG. 3B shows the corresponding timing diagram for FIG. 3A.
Figure 3C:
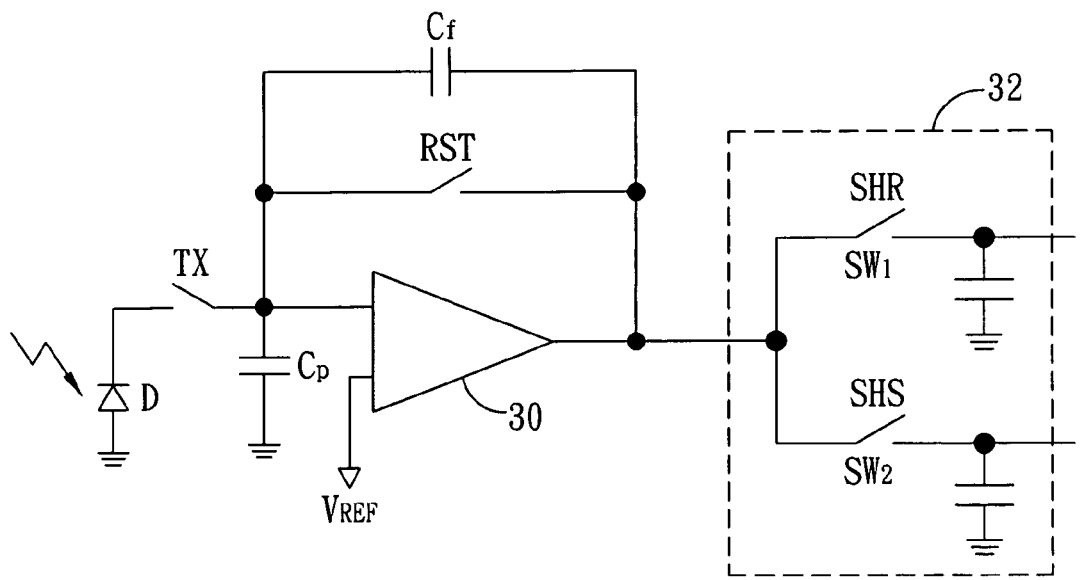
FIG. 3C illustrates a simplified equivalent block diagram of the amplifier and the feedback capacitor of FIG. 3A, along with a correlated double sampling (CDS) circuit.
Figure 3D:
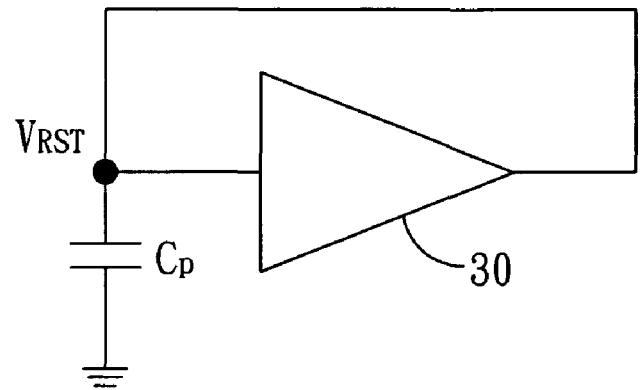
FIG. 3D illustrates a simplified equivalent block diagram of the amplifier and the feedback capacitor of FIG. 3A in a reset phase.

In the operation of the pixel circuit of FIG. 3A, three phases are performed as follows. FIG. 3B shows the corresponding timing diagram, and FIG. 3C illustrates a simplified equivalent block diagram of the amplifier 30 and the capacitor $C_f$, along with a CDS circuit 32. First, in a reset phase, the reset transistor $M_{rst}$ is turned on at time $t_1$ by a reset signal RST, and the transfer transistors $M_{tx1}$-$M_{tx4}$ are also turned on by transfer signals TX. Accordingly, the photodiodes $D_1$-$D_4$ are reset to their pinning voltages which are lower than reference voltage $V_{RST}$. The equivalent block diagram is shown in FIG. 3D. The total charge $Q_1$ at this phase can be expressed as the charge on the capacitor $C_p$ (i.e., $(V_{RST}-0)*C_p$). The total charge $Q_1$ is thus $Q_1=V_{RST}*C_p$.

Figure 3E:
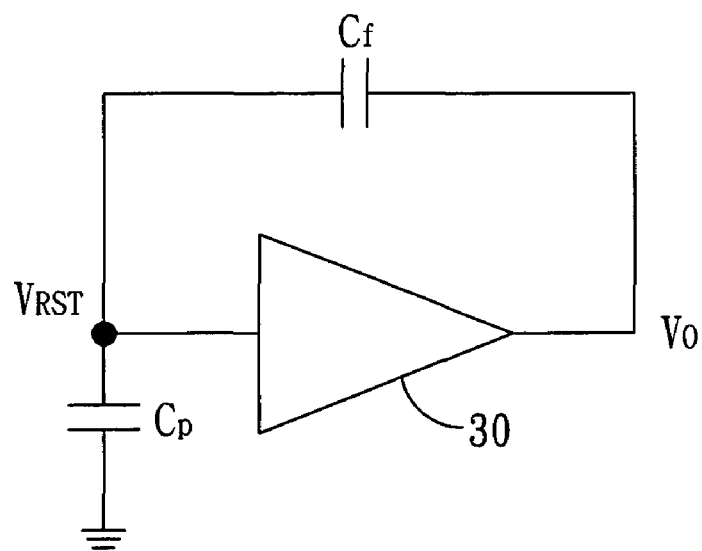
FIG. 3E illustrates a simplified equivalent block diagram of the amplifier and the feedback capacitor of FIG. 3A in an integration phase.

Second, in an integration or accumulation phase, the reset transistor $M_{rst}$ and the transfer transistors $M_{tx1}$-$M_{tx4}$ are turned off at time $t_2$, followed by subjecting the photodiodes $D_1$-$D_4$ to incident light. The voltage on the photodiodes $D_1$-$D_4$ decreases (or is discharged) proportionally to the intensity of incident light impinging on the corresponding photodiodes $D_1$-$D_4$. Accordingly, the amplifier 30 and the capacitor $C_f$ are equivalent to the block diagram of FIG. 3E. The total charge $Q_2$ at this phase can be expressed as the charge on the capacitor $C_p$ (i.e., $(V_{RST}-0)*C_p$) plus the charge on the capacitor $C_f$ (i.e., $(V_{RST}-V_o)*C_f$). Hence, the total charge $Q_2$ becomes $Q_2=V_{RST}*C_p+(V_{RST}-V_o)*C_f$.

Third, the reset transistor $M_{rst}$ is turned on again for a period (between time $t_3$ and $t_4$), during which the floating diffusion region FD is reset to the predetermined voltage as discussed above, followed by turning on the row selector transistor $M_{sel}$ to sample and hold the reset (or dark) voltage by closing a switch $SW_1$ under a control signal SHR. Subsequently, one of the transfer transistors $M_{tx1}$-$M_{tx4}$ is turned on at time $t_5$, while maintaining an on state of the row selector transistor $M_{sel}$, to sample and hold the integrated light signal (with accumulated charge $Q_{img}$) of the photodiodes $D_1$-$D_4$ at the FD by closing a switch $SW_2$ under a control signal SHS. The output voltage $V_o$ can be represented by the following equation:

$$V_o = \frac{Q_{img}}{C_p + C_f} \times \frac{C_p + C_f}{C_f} = \frac{Q_{img}}{C_f}$$

Accordingly, the conversion gain is now controlled by the feedback capacitor $C_f$ in the embodiment of the present invention, to eliminate the influence of the FD capacitance and the parasitic capacitance due to the shared pixels. The capacitance of the feedback capacitor $C_f$ can be adjusted by design, and by appropriately selecting the feedback capacitance $C_f$ the output voltage $V_o$ swing can be increased thereby increasing pixel sensitivity as well.

According to the embodiments, the output voltage $V_o$ is predominantly controlled by the feedback capacitor $C_f$ and is less influenced by the parasitic capacitance. Therefore, the routing of the conductive lines can be made to have less effect on the output voltage. This advantage may be exploited, for example, to facilitate sharing of more photodiodes without affecting the output voltage. In another example, this advantage may be exploited to increase the number of row lines without affecting the output voltage, such that different exposure time(s) in a frame may be achieved for enhancing dynamic range.

Although specific embodiments have been illustrated and described, it will be appreciated by those skilled in the art that various modifications may be made without departing from the scope of the present invention, which is intended to be limited solely by the appended claims.

What is claimed is:

1. An image sensor, comprising:
   at least two photodetectors;
   at least two transfer transistors configured to respectively transfer integrated light signals of the corresponding photodetectors to a first node;
   a floating diffusion region connected to the first node;
   a reset transistor configured to reset the first node to a predetermined reset voltage of a second node;
   a capacitor connected between the first node and the second node to minimize influence of an effective capacitance; and
   an amplifier configured to receive a voltage at the first node, and to provide an output at the second node, wherein the amplifier includes a source follower configured to buffer the integrated light signals that are transferred by the transfer transistors;
   wherein the reset transistor and the source follower are shared among the at least two photodetectors.

2. The image sensor according to claim 1, wherein the photodetector comprises a pinned photodiode.

3. The image sensor according to claim 1, further comprising a row selector transistor configured to activate the source follower of a selected row.

4. The image sensor according to claim 1, further comprising a power source connected between the second node and a power supply.

5. A low noise pixel readout circuit with high conversion gain, comprising:
   a plurality of photodiodes that are reverse-biased;
   a plurality of transfer transistors, each having one end connected to a corresponding one of the photodiodes and another end connected with other ends of the photodiodes, wherein the other ends are together connected together to a first node;
   a floating diffusion region connected to the first node, wherein an effective capacitance exists at the first node that includes a capacitance of the floating diffusion region and a parasitic capacitance due to the connected photodiodes and the transfer transistors;
   a reset transistor connected between the first node and a second node for resetting the first node to a predetermined reset voltage at the second node;
   an amplifier configured to receive a voltage at the first node, and to output at the second node, wherein the amplifier includes a source follower having a gate connected to the first node;
   a row selector transistor connected with the source follower in series between the second node and ground;
   a power source connected between a power supply and the second node; and
   a capacitor connected between the first node and the second node to minimize influence of the effective capacitance.

6. The circuit according to claim 5, wherein each of the photodiodes has an anode connected to ground and a cathode connected to a source/drain of an associated one of the transfer transistors.

7. The circuit according to claim 6, wherein others of the source/drain of the transfer transistors are connected together to the first node.

8. The circuit according to claim 5, whet cm the power source comprises two serial-connected PMOS transistors.

9. A low noise pixel readout circuit with high conversion gain, comprising:
   a plurality of photodiodes that are reverse-biased;
   a plurality of transfer transistors, each being connected to an associated one of the photodiodes at one end and having another end connected together with other ends of other ones of the transfer transistors to a first node;
   a floating diffusion region connected to the first node, wherein an effective capacitance at the first node includes a capacitance of the floating diffusion region and a parasitic capacitance due to the connected photodiodes and the transfer transistors;
   a reset transistor connected between the first node and a second node for resetting the first node to a predetermined reset voltage at the second node;

an amplifier configured to receive a voltage at the first node, and to output at the second node, wherein the amplifier includes a source follower having a gate connected to the first node;

a row selector transistor connected with the source follower in series; and a capacitor connected between the first node and the second node to minimize influence of the effective capacitance.

10. The circuit according to claim 9, wherein an anode of each of the photodiodes is connected to ground, and a cathode of each of the photodiodes is connected to an associated source/drain, of one of the transfer transistors.

11. The circuit according to claim 10, wherein sources/drains of others of the transfer transistors are connected together to the first node.

* * * * *